United States Patent
Bluck

(10) Patent No.: US 11,414,748 B2
(45) Date of Patent: Aug. 16, 2022

(54) SYSTEM WITH DUAL-MOTION SUBSTRATE CARRIERS

(71) Applicant: Intevac, Inc., Santa Clara, CA (US)

(72) Inventor: Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 392 days.

(21) Appl. No.: 16/583,165

(22) Filed: Sep. 25, 2019

(65) Prior Publication Data
US 2021/0087674 A1 Mar. 25, 2021

(51) Int. Cl.
| | |
|---|---|
| *H01L 21/677* | (2006.01) |
| *C23C 14/56* | (2006.01) |
| *C23C 14/34* | (2006.01) |
| *C23C 14/50* | (2006.01) |
| *H01L 21/67* | (2006.01) |

(52) U.S. Cl.
CPC ......... *C23C 14/566* (2013.01); *C23C 14/34* (2013.01); *C23C 14/505* (2013.01); *C23C 14/568* (2013.01); *H01L 21/6776* (2013.01); *H01L 21/67155* (2013.01); *H01L 21/67161* (2013.01); *H01L 21/67173* (2013.01); *H01L 21/67196* (2013.01); *H01L 21/67742* (2013.01)

(58) Field of Classification Search
None
See application file for complete search history.

(56) References Cited

U.S. PATENT DOCUMENTS 5,618,388 A * 4/1997 Seeser .................. C23C 8/02
118/719
5,798,027 A 8/1998 Lefebvre et al.
(Continued)

FOREIGN PATENT DOCUMENTS

| JP | 2014-208577 A | 11/2014 |
|---|---|---|
| TW | 201032282 A1 | 9/2010 |

(Continued)

OTHER PUBLICATIONS

International Search Report and Written Opinion dated Oct. 2, 2018, for PCT/US2018/042971, filed Jul. 19, 2018, 11 pages.
(Continued)

*Primary Examiner* — Jason Berman
(74) *Attorney, Agent, or Firm* — Womble Bond Dickinson (US) LLP; Joseph Bach, Esq.

(57) ABSTRACT

A processing system is provided, including a vacuum enclosure having a plurality of process windows and a continuous track positioned therein; a plurality of processing chambers attached sidewalls of the vacuum enclosures, each processing chamber about one of the process windows; a loadlock attached at one end of the vacuum enclosure and having a loading track positioned therein; at least one gate valve separating the loadlock from the vacuum enclosure; a plurality of substrate carriers configured to travel on the continuous track and the loading track; at least one track exchanger positioned within the vacuum enclosure, the track exchangers movable between a first position, wherein substrate carriers are made to continuously move on the continuous track, and a second position wherein the substrate carriers are made to transfer between the continuous track and the loading track.

21 Claims, 3 Drawing Sheets

(56) References Cited

U.S. PATENT DOCUMENTS

| | | | | |
|---|---|---|---|---|
| 6,132,562 | A | * 10/2000 | Baumecker | C23C 14/505 118/715 |
| 6,273,955 | B1 | * 8/2001 | Yoshino | C23C 16/24 118/718 |
| 6,335,054 | B1 | * 1/2002 | Baumecker | C23C 14/56 118/719 |
| 2010/0265206 | A1 | 10/2010 | Chen | |
| 2013/0161183 | A1 | 6/2013 | Leahey et al. | |
| 2013/0334031 | A1 | 12/2013 | Lee et al. | |
| 2014/0311893 | A1 | 10/2014 | Shah et al. | |
| 2015/0299470 | A1 | 10/2015 | Ngo et al. | |
| 2015/0345007 | A1 | 12/2015 | Rogers et al. | |
| 2016/0027623 | A1 | 1/2016 | Ishihara | |
| 2017/0139085 | A1 | 5/2017 | Schurmann et al. | |
| 2019/0025469 | A1 | 1/2019 | Bluck et al. | |

FOREIGN PATENT DOCUMENTS

| | | |
|---|---|---|
| TW | 201335413 A | 9/2013 |
| WO | 2017072711 A1 | 5/2017 |

OTHER PUBLICATIONS

International Search Report and Written Opinion dated Mar. 9, 2020, for PCT/US2019/056823, filed Oct. 17, 2019, 13 pages.
Examination Opinions of the Taiwan Intellectual Property Office for Taiwanese Patent No. 107125019, dated Sep. 3, 2019, pp. 6.

* cited by examiner

SYSTEM WITH DUAL-MOTION SUBSTRATE CARRIERS

BACKGROUND

1. Field

This disclosure relates generally to the field of substrate processing, such as thin-film coating of substrates.

2. Related Art

Vacuum processing of substrates is well known in the art, and referred to sometimes as thin-film processing. Generally, thin-film processing systems may be classified under one of three architectures: batch processing, cluster systems, and in-line systems. The advantages and shortcomings of each of these architectures are well known in the art.

In some system architectures, especially those used for fabricating microchips, the substrates are transported into the processing chambers individually and are placed on a chuck or a susceptor. Conversely, in other systems, e.g., those used for hard disk drive or solar cell fabrication, the substrates are transported and processed while positioned on substrate carriers.

A need exists in the art for improved system architecture, which can be used for forming thin films on different types of substrates. Moreover, there's a need in the art for machinery that can form the thin-film coating at high throughput and a commercially acceptable cost.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide a system specifically designed to form an improved thin-film coating at high volume manufacturing and at an acceptable commercial cost.

In the disclosed embodiments a vacuum enclosure has a plurality of processing chambers attached thereto. During processing carriers continuously move in unison inside the vacuum enclosure to be processed by the processing chambers. A loadlock section is attached to the vacuum enclosure and may have a loading side and an unloading side, which may share or have independent vacuum environment. Gate valves separate the loadlock section from the vacuum enclosure. Track exchangers are positioned within the vacuum enclosure. The track exchangers are movable between a first position, wherein carriers continuously move inside the vacuum enclosure, and a second position wherein the carriers are made to move between the vacuum enclosure and the loadlock section.

According to general aspects, a processing system is provided, including a vacuum enclosure having a plurality of process windows and a continuous track positioned therein; a plurality of processing chambers attached sidewalls of the vacuum enclosures, each processing chamber about one of the process windows; a loadlock attached at one end of the vacuum enclosure and having a loading track positioned therein; at least one gate valve separating the loadlock from the vacuum enclosure; a plurality of substrate carriers configured to travel on the continuous track and the loading track; at least one track exchanger positioned within the vacuum enclosure, the track exchangers movable between a first position, wherein substrate carriers are made to continuously move on the continuous track, and a second position wherein the substrate carriers are made to transfer between the continuous track and the loading track.

In further aspects, a substrate processing system is provided, comprising:
a loadlock section having a first side and a second side opposite the first side;
an atmospheric section coupled to the first side of the loadlock section;
a vacuum section attached to the second side of the loadlock section and having a plurality of processing chambers attached thereto;
a carrier transport mechanism comprising:
  i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
  ii. a motive element positioned at the racetrack,
  iii. a plurality of motorized wheels positioned along the second monorail section,
  iv. two track exchangers positioned at one end of the first monorail section, each track exchanger comprising a movable table, a straight monorail section positioned on the table, and a curved monorail section positioned on the table,
and a plurality of carriers having a plurality of wheels and configured to engage the monorail to have the carrier ride on the monorail.

In one embodiment the system is made up of a loadlock section having a first side and a second side opposite the first side; an atmospheric section attached to the first side of the loadlock section; a vacuum section attached to the second side of the loadlock section and having a plurality of processing chambers attached thereto; a carrier transport mechanism comprising:
  i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
  ii. an endless belt positioned at the racetrack and having a plurality of drive forks attached thereto,
  iii. a driving wheel positioned in the atmospheric section and having a plurality of drive forks attached thereto,
  iv. a plurality of motorized wheels positioned along the second monorail section,
  v. two track exchangers positioned at one end of the first monorail section, each track exchanger comprising a movable table, a linear monorail section positioned on the table, and a curved monorail section positioned on the table, a plurality of carriers, each carrier having a base, a plurality of wheels attached to the base and configured to engage the monorail to have the carrier ride freely on the monorail, a drive bar attached to the base, the drive bar configured to engage the plurality of motorized wheels so as to move the carrier while riding on the second monorail section, and a drive pin attached to the base and configured to engage the driving forks so as to move the carrier while in the first or third monorail section; and wherein when the track exchangers are in a first position the curved monorail section is aligned with the first monorail section causing the carriers to be continuously moved by the driving forks along the first monorail section, and when the track exchangers are in a second position the linear monorail section connects the first monorail section to the second monorail section causing carriers to be exchanged between the loadlock section and the vacuum section.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2A illustrates one embodiment of a dual-motion substrate carrier, while

DETAILED DESCRIPTION

Embodiments of the inventive system for fabricating thin-film coating and its dual-motion carriers will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Disclosed embodiments provide a system architecture that enables continuous processing of substrates inside the vacuum chamber using a first mode of carrier motion, and a mechanism to transport the carriers out of the vacuum chamber using a second mode of carrier motion. In either modes of carrier motion, the carrier freely rides on tracks, but the motive power applied to the carrier to make it ride on the tracks is different in each of the modes of carrier motion modes. While inside the vacuum chamber, all of the carriers are moved in unison, but when exiting the vacuum chamber, the carriers may be moved independently.

Figure 1:
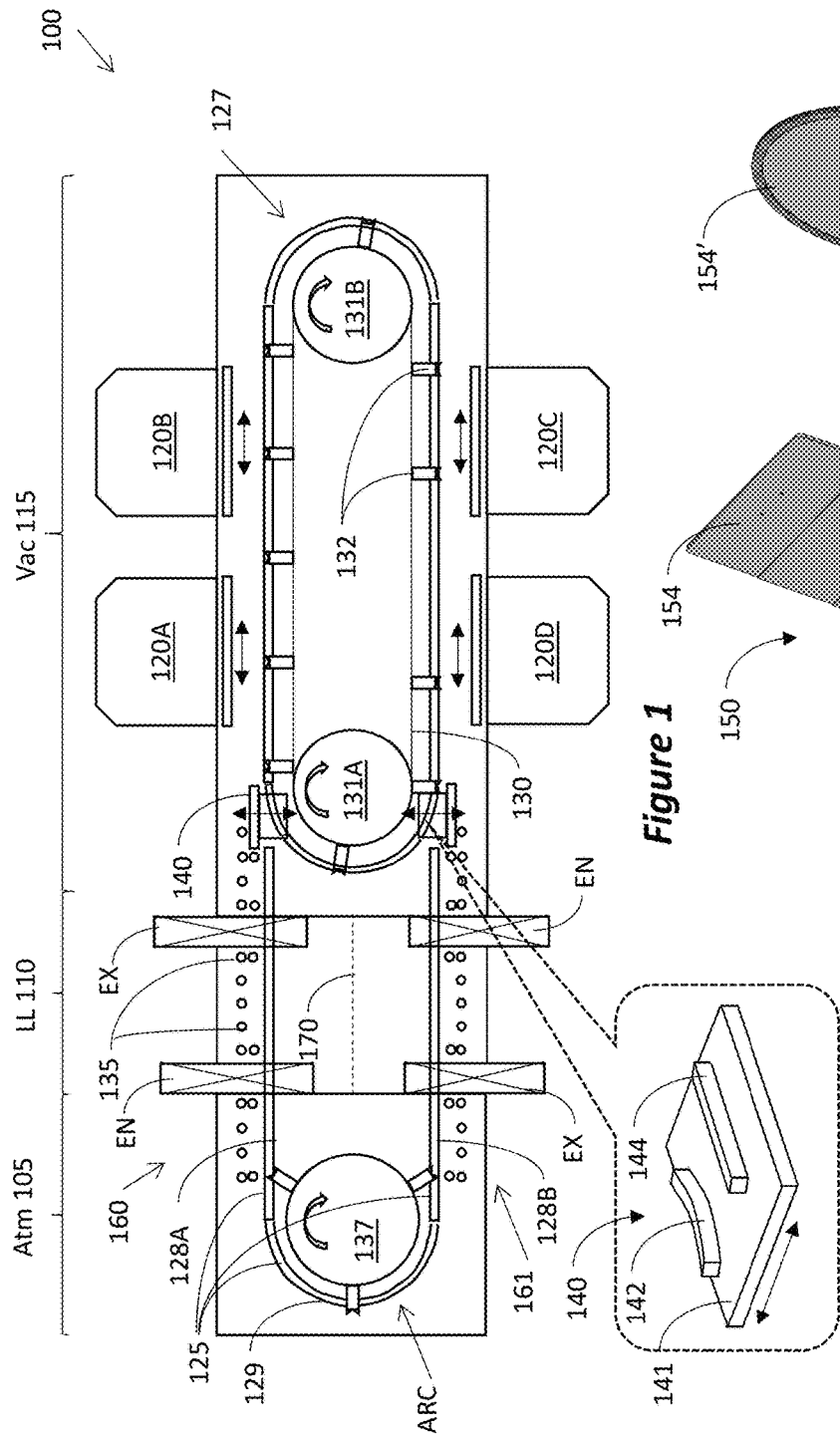
FIGS. 1, 1A and 1B illustrate embodiments of a modular system for forming thin-film coatings using dual-motion carriers.
Figure 2A:
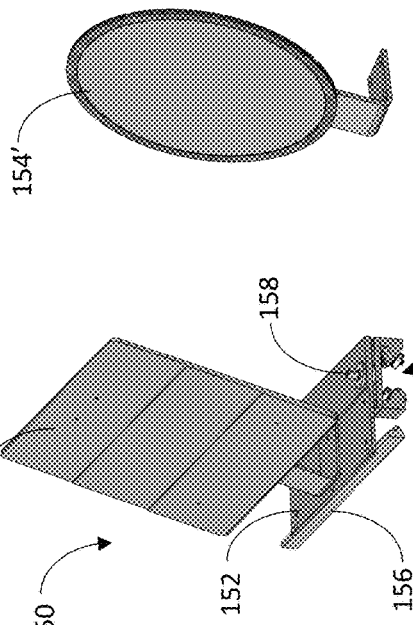
Figure 2B:
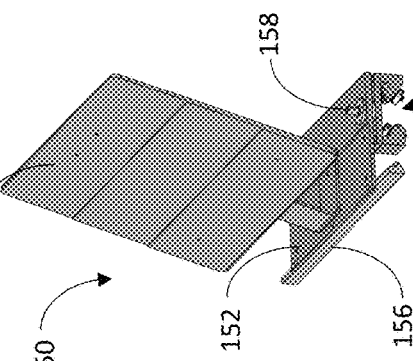
FIG. 2B illustrates a substrate holder for round substrates.

A first embodiment will now be described with reference to FIG. 1, in conjunction with Figured 2A and 2B. FIG. 1 illustrates a top schematic view of the system, while FIG. 2A illustrates a carrier and FIG. 2B illustrates a replacement substrate holder for the carrier of FIG. 2A.

In FIG. 1 the system 100 is made up of an atmospheric section 105, a loadlock section 110, and a vacuum section 115. The carriers are loaded and unloaded in the atmospheric section 105, and are transferred between the atmospheric section 105 and vacuum section 115 via the loadlock section 110. The substrates are processed inside the vacuum section 115. In this example four processing chambers 120A-120D are illustrated, but any number of processing chamber may be provided, as will be shown further below. Each of the processing chambers 120A-120D may be an etch chamber, a sputtering chamber, an ion implant chamber, etc. As shown, in this embodiment the processing chambers are connected to a common vacuum atmosphere without valve gates between them.

Monorail segments 125 are provided in the three sections, 105, 110 and 115, enabling a substrate carrier to traverse all three sections. The monorail segments form a racetrack monorail 127 inside the vacuum section, form linear tracks 128A and 128B traversing the loadlock section and extending partially into the atmospheric section and partially into the vacuum section, and forming a curved, crescent shaped, rotation track 129 in the atmospheric section. An endless belt 130 is provided over rotation drums 131A and 131B inside the vacuum section 115, the endless belt 130 having a plurality of motive forks 132 attached thereto. A plurality of energized wheels 135 is provided next to the linear tracks, and a rotation wheel 137 with motive forks 132 is provided in the atmospheric section.

Two track exchangers 140 are provided inside the vacuum section, an enlargement view of which is provided in the callout. The track exchanger comprises a table 141 upon which two track segments are provided, a curved track segment 142 and a straight track segment 144. As shown by the double-headed arrows in FIG. 1, the track exchanger is movable into one of two positioned. In one position the curved track segment completes the racetrack 127, such that carriers within the vacuum section continuously move along the racetrack to continuously process substrates by chambers 120A-120D. When processing of the substrates within the vacuum chamber is completed, the track exchanges is moved to the second position, wherein the linear track forms a connection between the linear tracks 128A and 128B and the straight section of the racetrack 127, such that the carriers inside the vacuum chamber exit to the loadloack, while carriers inside the loadlock enter the vacuum section.

An embodiment of the substrate carrier 150 is illustrated in FIG. 2A. In this embodiment, the carrier 150 has a base 152 and a substrate holder 154. The substrate holder 154 is detachable from the base to enable processing of different shapes and number of substrates. For example, the holder 154 shown in FIG. 2A holds square or rectangle substrate in three levels, while the holder 154' shown in FIG. 2B holds a round substrate.

As illustrated in FIG. 2A, the base 152 includes a roller arrangement 153 that engages and rides on the monorail 125. This roller arrangement is not motorized and may include a plurality of freely rotating wheels, such that the base can freely ride on the monorail. Motive power comes from either the wheels 135 engaging the drive bar 156, or one of the forks 132 engaging the drive pin 158.

An example of the process performed in the system 100 will now be described. An empty carrier is driven to the loading station 160 and substrates are loaded onto the carrier where the roller arrangement 153 engage the linear track 1A and motorized wheels 135 engage the drive bar 156. Fresh substrates are loaded onto the substrate holder 154. Meanwhile, processed substrates may be removed from another carrier positioned at the unloading station 161. Once loading and unloading is completed, entrance gate valve EN of the loadlock in the loading section 160 is opened. Optionally, the exit gate valves EX of the loadlock of the unloading section 161 is opened. The exit gate valve EX of the loading loadlock remains closed. Also, if the exit gate valve of the unload section is opened, then its entrance gate valve is closed. In some embodiments the two loadlocks are independent, as exemplified by the broken line partition 170, such that each can maintain vacuum independently of the other. In such a case, while fresh carrier is loaded into the loading loadlock, a processed carrier can be loaded from the vacuum section into the unloading loadlock 161. Note that entrance and exit gate valves are identified with respect to the carrier travel direction, although the structure of entrance and exit gate valves are the same. That is, if the travel direction would be flipped, the designation of entrance and exit valves would also be flipped.

In this condition the motorized wheels 135 are energized, such that a carrier in the loading station is transferred to the respective load lock, while a carrier inside the other loadlock can be moved to the atmospheric section 105 and/or a processed carrier can be moved into the unloading loadlock. Note, however, that it is not mandatory to perform these operations simultaneously. Alternatively, loading can be done separately in time, such that only the entrance valve of the carrier with the fresh substrates is opened and it is moved into the loadlock, while the motorized wheels in the unload section are not energized. That is, the motorized wheels in the linear track section can be energized independently or in groups, such that only a sub-group of the motorized wheels is energized. Also, when the loadlocks are independent, i.e., have independently dedicated pumping arrangement, then the various gate valves can also be energized independently, such that loading and unloading need not be synchronized. Of course, for operation efficiency, it is beneficial to synchronize operations.

In embodiments wherein the loadlocks maintain a common vacuum atmosphere and are commonly pumped, e.g., when there is no partition 170, the gate valves operate synchronously. For example, gate valve EN of the loading loadlock would operate together with the EX gate valve of the unloading loadlock, and the EX gate valve of the loading loadlock would operate together with the EN gate valve of the unloading loadlock.

When the carrier enters the loadlock, the entrance gate valve is closed and vacuum is drawn. If a processed carrier has been extracted out of the exit loadlock, then it also pumped to vacuum condition. When the appropriate vacuum level has been achieved, the exit gate valve EX of the loading load lock is opened, and the appropriate motorized wheels are energized to move the carrier into the vacuum section 115. At this time, the track exchanger 140 is moved to assume a position wherein the linear track section 144 is aligned with the straight section of the race track monorail 127. Consequently, when the wheels are energized to move the carrier into the vacuum section, the carrier enters the race track circuit, and one of the motive forks engages the drive pin 158. Then the track exchanger 140 is moved to assume a position wherein the curved track section 142 is aligned with the straight section of the race track monorail 127. In this position, the carrier is moved by the endless belt 130, not the motorized wheels 135. Also, in this condition, as the endless belt rotates, the carrier would travel along the racetrack as many circuits as needed, until it is ready to exit the processing section. Consequently, the substrates on the carrier can be repeatedly processed by each of chambers 120A-120D as many times as needed.

When processing is completed, the track exchanger 140 of the unload section is moved to assume a position wherein the linear track section 144 is aligned with the straight section of the race track monorail 127. As the endless belt continues to rotate, the carrier is moved into the track exchanger and disengages from the motive fork, while at the same time the drive bar 156 engages the motorized wheels 135. The motorized wheels can then be energized so as to drive the carrier out of the racetrack circuit.

As can be seen, in the embodiment described, the carrier has two modes of motive, engaging motorized wheel over the linear track, while engaging motive forks in the racetrack and in the atmospheric return circuit ARC. In the racetrack the forks are attached to an endless belt, while in the atmospheric return circuit the forks are attached to a driving wheel. Also, track exchangers are using to introduce or remove carriers into/from the racetrack. In one position the track exchanger enables the carrier to be driven endlessly around the race track, while in its second position it enables introducing or removing carriers into/from the racetrack.

Figure 1A:
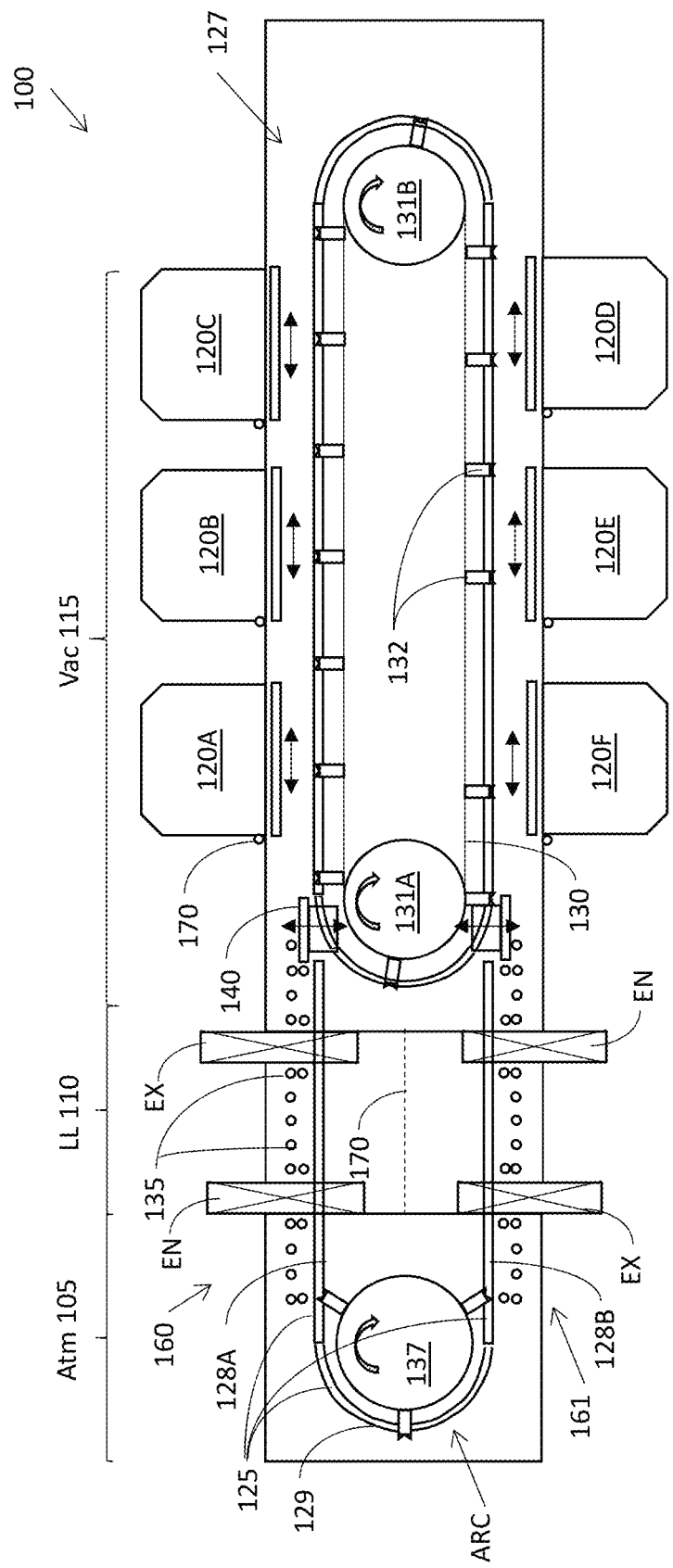

As noted previously, the system is adaptable to include as many processing chambers as necessary. An example is illustrated in FIG. 1A. The example shown in FIG. 1A is similar to that shown in FIG. 1, and similar elements are indicated by the same reference. The main difference is that the system of this example includes six processing chambers, 120A-120F. Otherwise, all of the elements may be the same as that of FIG. 1, illustrating the versatility of this architecture.

Figure 1B:
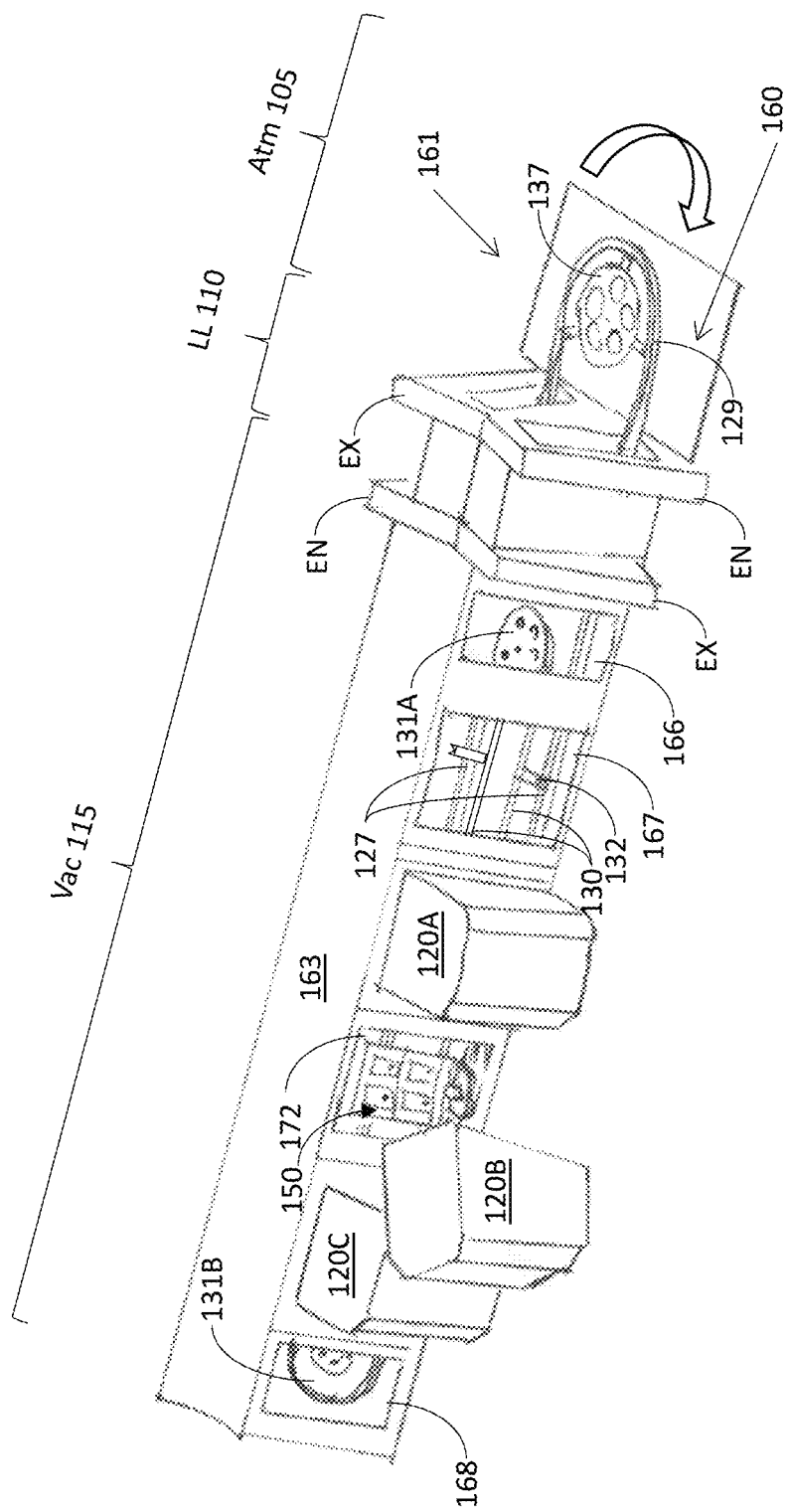

FIG. 1B provides an external view of an embodiment having six processing chambers, 120A-120C are visible in this perspective. Again, the system is made up of three sections: an atmospheric section 105, a loadlock 110, and a vacuum section 115, which includes the vacuum enclosure 163 onto which the processing chamber are attached. In the illustration the service access windows 166, 167 and 168 are shown open, to enable visualization of the interior of the vacuum enclosure. For example, rotation drums 131A and 131B can be seen from the service access windows 166 and 168, respectively. Parts of the racetrack monorail 127 and endless belt 130 are visible through the service access window 167.

In this example, chamber 120B is shown in an opened position, making easy access for service of the processing chamber and of the interior of the vacuum enclosure via process window 172. Specifically, in this example, the process chambers 120A-120C are attached to the vacuum enclosure 163 via a rotatable hinge 170 (obscured from view in FIG. 1B, but shown in FIG. 1A). As chamber 120B is rotated on its hinge, it exposes the interior of the vacuum enclosure 163, wherein a carrier 150 with four substrates is shown.

The architectures disclosed so far provide a substrate processing system having an atmospheric section 105; a loadlock section 110; and a vacuum section 115 having a plurality of processing chambers 120 attached thereto. A carrier transport mechanism comprises: a monorail formed as: first monorail section 127 shaped as a racetrack and positioned within the vacuum section, a second monorail section having two parallel linear monorails 128A and 128B positioned within the loadlock section and having extensions into the atmospheric section and the vacuum section, and a third curved monorail section, in the form of a crescent rotation track 129, positioned in the atmospheric section and having one end meeting the extension of one of the linear monorails and another end meeting the extension of another one of the linear monorails, an endless belt 130 positioned at the racetrack and having a plurality of drive forks 132 attached thereto, a driving wheel 137 positioned in the atmospheric section and having a plurality of drive forks 132 attached thereto, a plurality of motorized wheels 135 positioned along the second monorail section, and two tack exchanges 140 positioned at one end of the first monorail section, each track exchanger 140 having a movable table 141, a linear monorail section 144 positioned on the table, and a curved monorail section 142 positioned on the table.

A plurality of carriers support substrates to be processed, each carrier having a base 152, a plurality of free-rotating wheels 153 attached to the base and configured to engage the monorail to have the carrier ride freely on the monorail, a drive bar 156 is attached to the base, the drive bar configured to engage the plurality of motorized wheels 135 so as to move the carrier while riding on the second monorail section, and a drive pin 158 is attached to the base and configured to engage the driving forks 132 so as to move the carrier while in the first or third monorail section.

When the track exchangers are in a first position the curved monorail section is aligned with the first monorail section causing the carriers to be continuously moved by the driving forks along the first monorail section, and when the track exchangers are in a second position the linear monorail section connects the first monorail section to the second monorail section causing carriers to be exchanged between the loadlock section and the vacuum section.

A method for processing substrates in the disclosed processing system may include the steps comprising: loading the substrates onto a carrier; transporting the carriers over a transport track into a loadlock; pumping vacuum inside the loadlock; transporting the carrier on the transport track into a processing enclosure having a plurality of processing chambers attached thereto; operating a track exchanger to assume a first position thereby forming a connection between the transport track and a processing track, and moving the carrier on the track exchanger and thence to the processing track inside the processing enclosure; operating the track exchanger to assume a second position, thereby separating the processing track from the processing track; continuously moving the carrier on the processing track while energizing the processing chambers; and, when processing is completed, operating the track exchanger to assume the first position and transporting the carrier from the processing track onto the transport track. Continuously moving the carrier may comprise continuously moving a plurality of carriers in unison, e.g., by coupling the plurality of carriers to an endless belt.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A substrate processing system, comprising:
   a vacuum enclosure having a plurality of process windows and a continuous track positioned therein;
   a plurality of processing chambers attached sidewalls of the vacuum enclosures, each processing chamber about one of the process windows;
   a loadlock attached at one end of the vacuum enclosure and having a loading track positioned therein;
   at least one gate valve separating the loadlock from the vacuum enclosure;
   a plurality of substrate carriers configured to travel on the continuous track and the loading track;
   at least one track exchanger positioned within the vacuum enclosure, the track exchangers movable between a first position, wherein substrate carriers are made to continuously move on the continuous track, and a second position wherein the substrate carriers are made to transfer between the continuous track and the loading track;
   an endless belt positioned inside the vacuum enclosure;
   a plurality of motorized wheels positioned inside the loadlock;
   wherein the substrate carriers engage the endless belt when traveling on the continuous track and engage the motorized wheels when traveling on the loading track;
   wherein the endless belt comprises a plurality of driving forks and each of the substrate carriers comprises:
   a plurality of freely rotating wheels configured to engage the continuous track and the loading track;
   a driving bar configured to engage the motorized wheels; and,
   a driving pin configured to engage the driving forks.

2. The system of claim 1, further comprising an atmospheric section attached to the loadlock opposite to the vacuum enclosure, the atmospheric section comprising:
   a return track; and,
   a drive wheel having a plurality of drive forks attached thereto.

3. The system of claim 1 wherein the continuous track comprises a racetrack monorail and the loading track comprises a straight monorail.

4. The system of claim 3, wherein the track exchanger comprises a base, a curved monorail section positioned on the base, and a straight monorail section positioned on the base.

5. The system of claim 1, wherein each of the processing chambers is attached to the vacuum enclosure via a rotating hinge.

6. The system of claim 1, wherein at least one of the plurality of processing chambers comprises a sputtering source having a shutter.

7. A substrate processing system, comprising:
   a loadlock section having a first side and a second side opposite the first side;

an atmospheric section coupled to the first side of the loadlock section;

a vacuum section attached to the second side of the loadlock section and having a plurality of processing chambers attached thereto;

a carrier transport mechanism comprising:
  i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
  ii. a motive element positioned at the racetrack,
  iii. a plurality of motorized wheels positioned along the second monorail section,
  iv. two track exchangers positioned at one end of the first monorail section, each track exchanger comprising a movable table, a straight monorail section positioned on the table, and a curved monorail section positioned on the table, a plurality of carriers having a plurality of wheels and configured to engage the monorail to have the carrier ride on the monorail.

8. The system of claim 7, wherein each of the plurality of carriers comprises a drive bar attached to a base, the drive bar configured to engage the plurality of motorized wheels so as to move the carrier while riding on the second monorail section.

9. The system of claim 8, wherein each of the plurality of carriers further comprises engagement mechanism attached to the base and configured to engage the motive element so as to move the carrier while in the first monorail section.

10. The system of claim 9, wherein when the track exchangers are in a first position the curved monorail section is aligned with the first monorail section causing the carriers to be continuously moved along the first monorail section, and when the track exchangers are in a second position the straight monorail section connects the first monorail section to the second monorail section causing carriers to be exchanged between the loadlock section and the vacuum section.

11. The system of claim 9, wherein the atmospheric section comprises an unloading section and a loading section, and further comprising an exchanger to transfer carriers from the unloading section to the loading section.

12. The system of claim 11, wherein the exchanger comprises a driving wheel.

13. The system of claim 7, wherein the motive element comprises an endless belt positioned at the racetrack and having a plurality of drive forks attached thereto.

14. A substrate processing system, comprising:
a loadlock section having a first side and a second side opposite the first side;
an atmospheric section attached to the first side of the loadlock section;
a vacuum section attached to the second side of the loadlock section and having a plurality of processing chambers attached thereto;
a carrier transport mechanism comprising:
  i. a monorail formed as: a first monorail section shaped as a racetrack and positioned within the vacuum section, a second monorail section having two parallel linear monorails positioned within the loadlock section and having extensions into the atmospheric section and the vacuum section, and a third monorail section positioned in the atmospheric section and shaped as a curve having one end meeting the extension of one of the linear monorails and another end meeting the extension of another one of the linear monorails,
  ii. an endless belt positioned at the racetrack and having a plurality of drive forks attached thereto,
  iii. a driving wheel positioned in the atmospheric section and having a plurality of drive forks attached thereto,
  iv. a plurality of motorized wheels positioned along the second monorail section,
  v. two track exchangers positioned at one end of the first monorail section, each track exchanger comprising a movable table, a linear monorail section positioned on the table, and a curved monorail section positioned on the table,
a plurality of carriers, each carrier having a base, a plurality of wheels attached to the base and configured to engage the monorail to have the carrier ride freely on the monorail, a drive bar attached to the base, the drive bar configured to engage the plurality of motorized wheels so as to move the carrier while riding on the second monorail section, and a drive pin attached to the base and configured to engage the driving forks so as to move the carrier while in the first or third monorail section;
wherein when the track exchangers are in a first position the curved monorail section is aligned with the first monorail section causing the carriers to be continuously moved by the driving forks along the first monorail section, and when the track exchangers are in a second position the linear monorail section connects the first monorail section to the second monorail section causing carriers to be exchanged between the loadlock section and the vacuum section.

15. The system of claim 14, wherein each of the substrate carriers further comprises a substrate holder removably attached to the base.

16. The system of claim 14, wherein each of the plurality of processing chambers includes a shutter.

17. The system of claim 14, wherein the loadlock section comprises a loading loadlock and an unloading loadlock having independent vacuum environment of each other.

18. The system of claim 14, wherein at least one of the plurality of processing chambers comprises a sputtering source having a shutter.

19. The system of claim 14, the plurality of processing chambers are connected to a common vacuum atmosphere without valve gates between them.

20. The system of claim 14, wherein the atmospheric section comprises a loading section and an unloading section.

21. The system of claim 14, wherein the loadlock section comprises a loading loadlock and an unloading loadlock maintaining a common vacuum atmosphere and having gate valves that operate synchronously.

* * * * *